United States Patent [19]

Steere et al.

[11] Patent Number: 4,638,601
[45] Date of Patent: Jan. 27, 1987

[54] AUTOMATIC EDGE GRINDER

[75] Inventors: Robert Steere, Boonton; Thomas Lewandowski, Wanaque, both of N.J.

[73] Assignee: Silicon Technology Corporation, Oakland, N.J.

[21] Appl. No.: 794,629

[22] Filed: Nov. 4, 1985

[51] Int. Cl.⁴ .............................................. B24B 9/10
[52] U.S. Cl. ................... 51/165.71; 51/5 R; 51/101 R; 51/165.72; 51/283 E
[58] Field of Search ....... 51/101 R, 101 LG, 105 EC, 51/165.71, 165.77, 283 E, 165.72, 5 R

[56] References Cited

U.S. PATENT DOCUMENTS

| | | | |
|---|---|---|---|
| 3,584,421 | 6/1971 | Lob | 51/101 R |
| 3,913,272 | 10/1975 | Johnson | 51/101 R |
| 4,023,084 | 5/1977 | Owa | 51/165.77 |
| 4,203,259 | 5/1980 | Haddock | 51/101 LG |
| 4,344,260 | 8/1982 | Ogiwara | 51/283 E |
| 4,528,780 | 7/1985 | Halberschmidt | 51/101 R |

FOREIGN PATENT DOCUMENTS 114851  7/1983  Japan .............................. 51/101 LG Primary Examiner—Harold D. Whitehead
Attorney, Agent, or Firm—Kenyon & Kenyon

[57] ABSTRACT

The edge profile machine employs a centering station in which a photosensor measures a number of points on the periphery of a wafer so that the shape of the wafer and location of the geometric center can be determined in a computer. A rotatable head serves to position the geometric center of the wafer on a fixed axis and the wafer transferred to a grinding station with the geometric center located on the central axis of a rotating chuck. During grinding, a grinding wheel is moved in accordance with the differences between the detected shape of the wafer and a predetermined shape. The grinding wheel is moved on an axis perpendicular to an axis passing through the centering station and grinding station in accordance with signals received from the computer.

31 Claims, 10 Drawing Figures

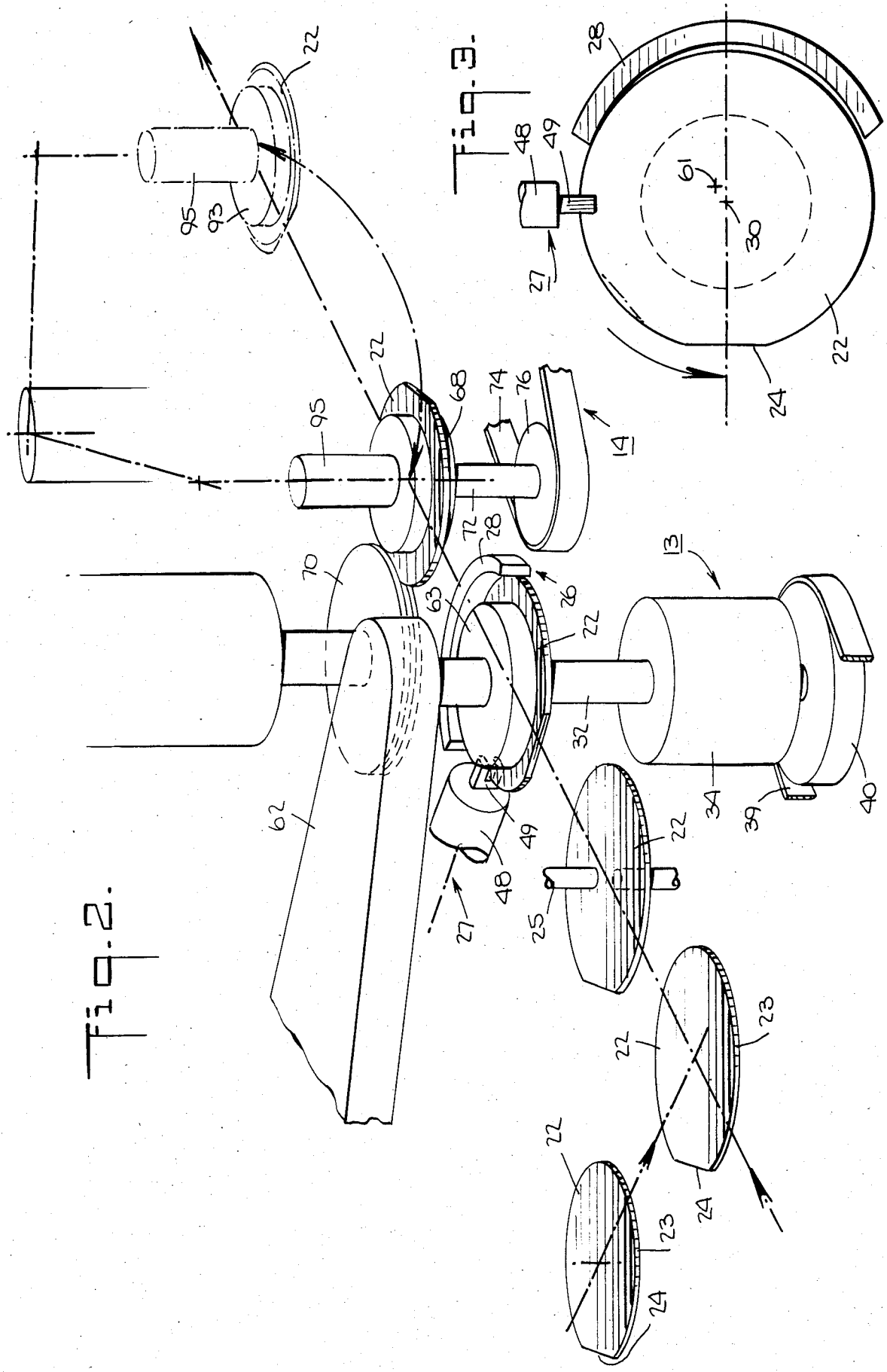

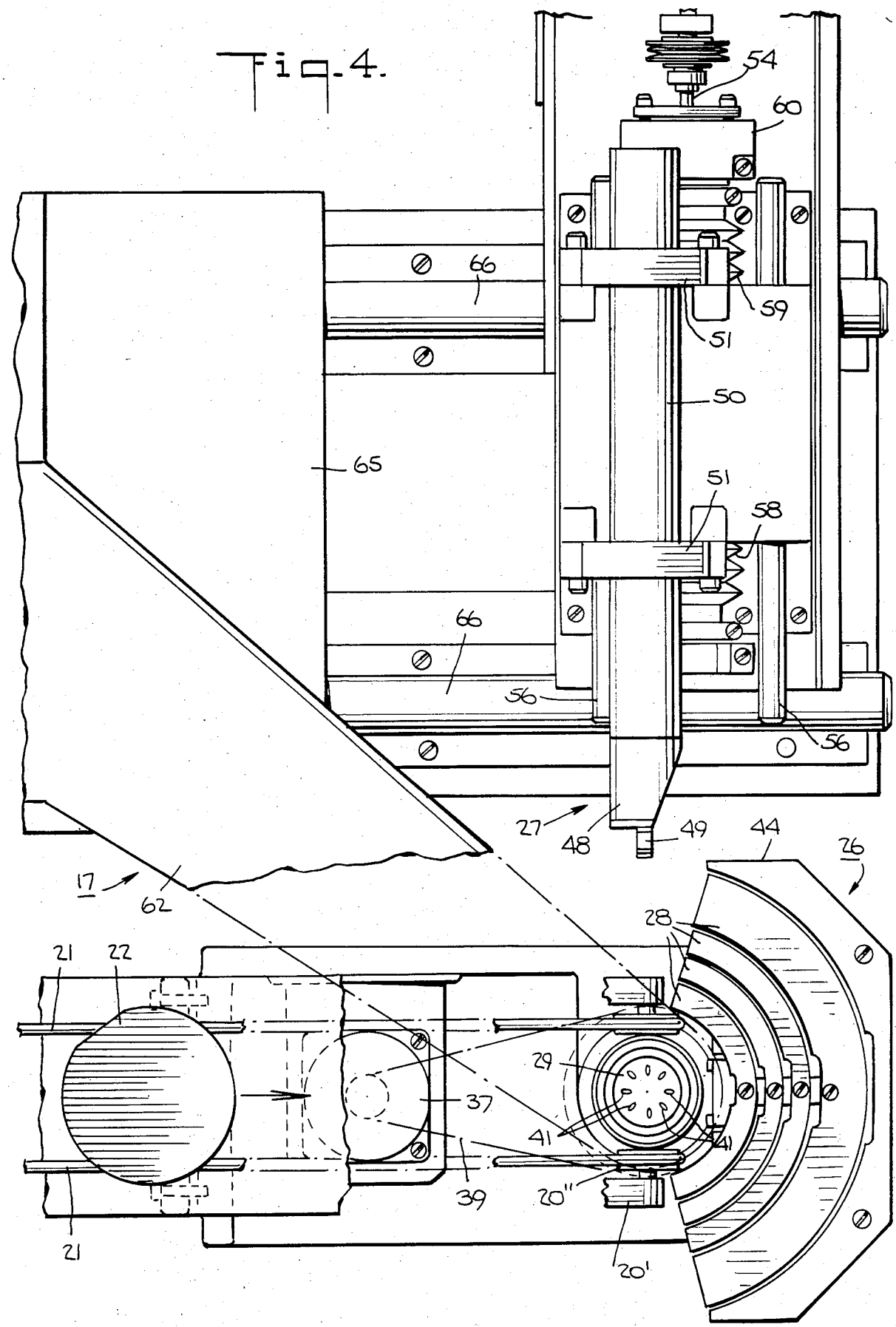

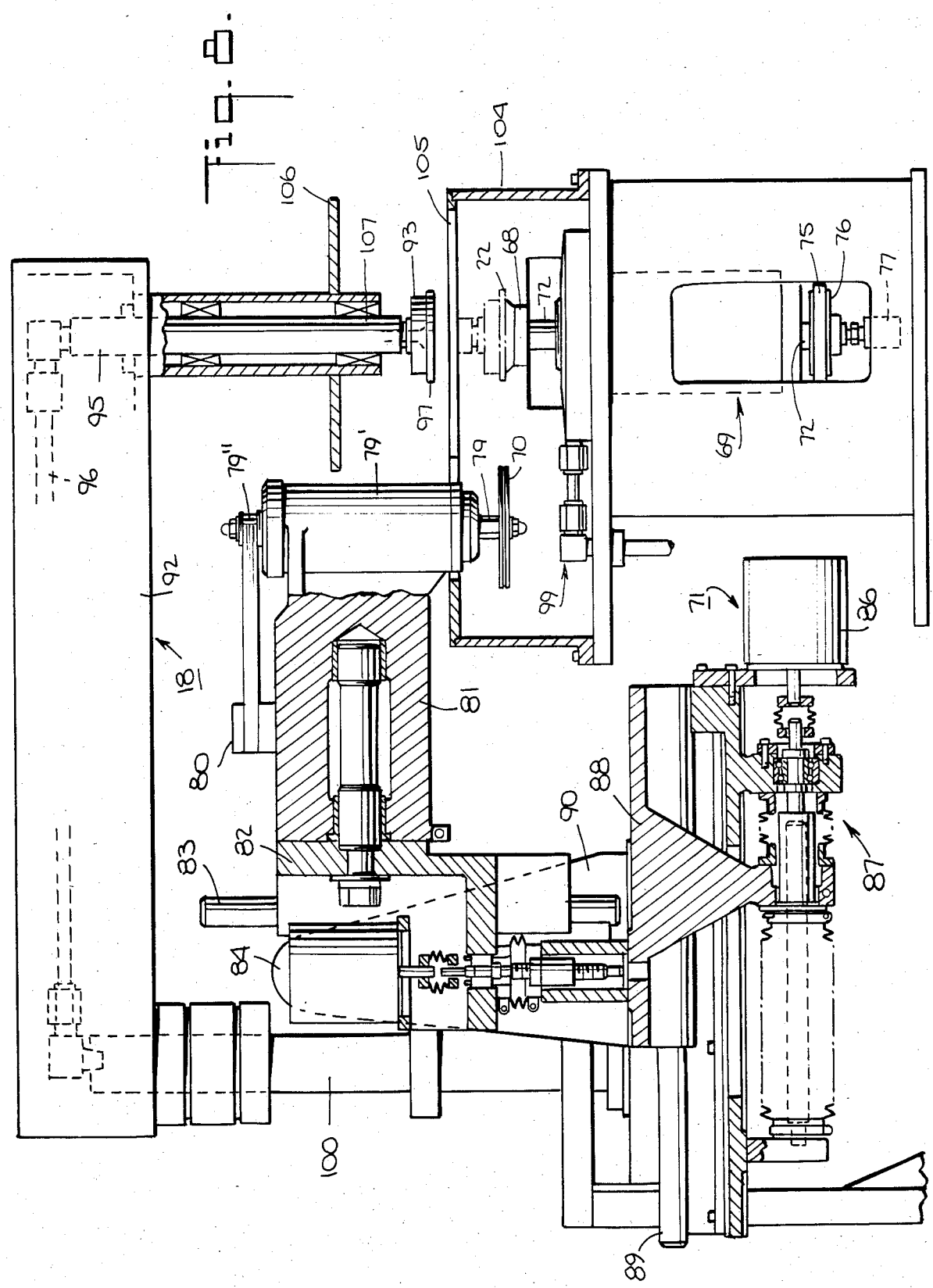

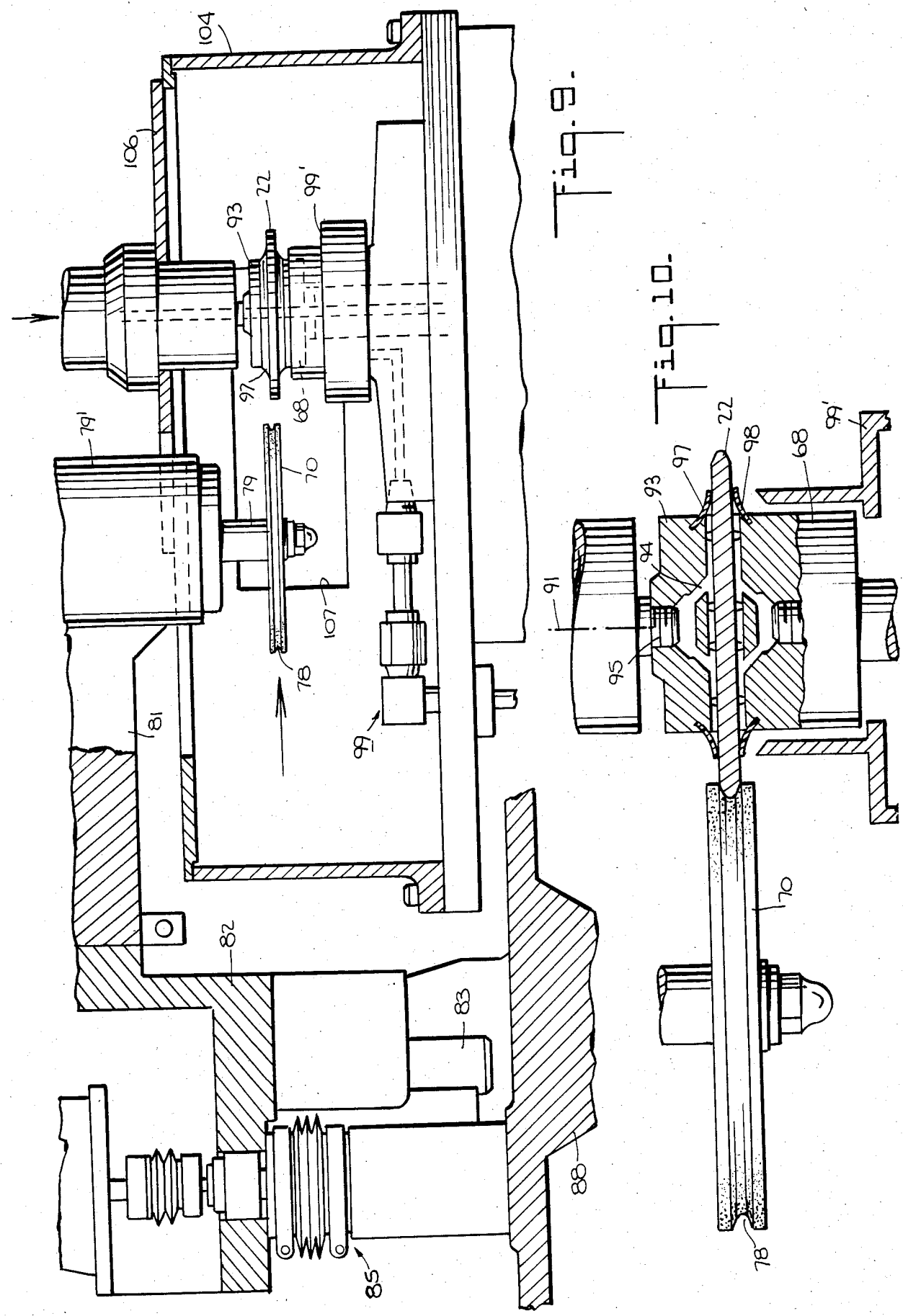

AUTOMATIC EDGE GRINDER

This invention relates to an automatic edge grinder. More particularly, this invention relates to an automatic edge grinder for grinding wafers. More particularly, this invention relates to a method of edge grinding a wafer having a circular periphery with a flat.

As is known, the source material for manufacturing semi-conductor chips is usually a relatively large wafer, for example, of silicon. Generally, these wafers are obtained by slicing a cylindrical ingot, for example of pure silicon, into thin pieces to obtain wafers with a circular periphery and a small flat in the periphery. The purpose of the flat is usually to provide for orientation of the wafer during subsequent operations.

After slicing from an ingot, the wafers usually require grinding of the peripheral edge to a prticular profile, for example to a parabolic profile. The ground edge serves to prevent cracking of the wafers during subsequent handling while avoiding sharp edges.

Heretofore, various types of techniques have been employed to edge grind a wafer intended for the semi-conductor industry. In one case, a grinding wheel is held against the wafer under a spring bias in order to grind the edge to the appropriate profile. However, with this technique, should a wafer not be truly circular, the spring-biased grinding wheel is unable to accurately grind the wafer to a true circular periphery.

A second technique utilizes machines which employ a cam representative of the wafer shape and a grinding wheel on a cam follower which is held by a weight and pulley to apply a constant force on a wafer to be ground. With this technique, material is removed from a wafer until the cam and cam follower are in contact for one complete revolution. However, this type of technique is cumbersome and, because of the mechanical linkages between the various components, requires a relatively large amount of space. Further, should the size of wafer being ground be changed, for example from a three inch to a four inch or six inch wafer, the various mechanical linkages require substantial adjustment in order to accommodate the differently sized wafers.

Accordingly, it is an object of the invention to provide a relatively simple technique for edge grinding a wafer in an accurate manner.

It is another object of the invention to reduce the cost of edge grinding a wafer for use by the semi-conductor industry It is another object of the invention to provide an edge grinder which is able to accommodate different sized wafers.

It is another object of the invention to provide an edge grinder which is able to automatically grind a wafer to an accurate shape.

Briefly, the invention provides an automatic edge grinder as well as a method of edge grinding a wafer.

The automatic edge grinder is constructed with at least one wafer unloading station for delivering a series of wafers, a thickness measuring station, a centering station, a grinding station, a loading station for receiving a series of edge-grinding wafers and transfer mechanisms for moving the wafers individually between the respective stations.

The thickness measuring station is constructed to sequentially receive a series of wafers from the unloading station and is provided with means for measuring the thickness of each delivered wafer. For example, the means may include an air gauge for sensing the thickness of a central region of a wafer.

The centering station has means for centering a wafer therein as well as probe means for aligning a centered wafer relative to a longitudinal axis extending through the centering station to the grinding station. The centering station may include a plurality of concentrically disposed arcuate centering stops each of which is adjustably mounted to selectively abut and center a correspondingly sized wafer received in the centering station. In addition, a head is disposed within the centering station for receiving a wafer while means are provided for rotating the head. For example, the head may be a vacuum head while the means for rotating the head includes a hollow shaft which has a bore in communication with the head and a vacuum source so that a suction force can be created at the head to hold a wafer thereon during rotation of the shaft.

The probe means used in the centering station employs a photosensor for sensing the edge of a centered wafer at a number of points on the wafer periphery while generating signals in response to the sensed edge. For example, the photosensor can be reciprocated while the wafer is rotated in order to obtain a sequence of signals corresponding to the points at which the photosensor stops upon sensing the edge of the wafer. By having each signal correspond to the distance travelled by the photosensor from a "home" position, the distance of each sensed point from a fixed point, such as the axis of rotation of the vacuum head, can be calculated.

The edge grinder also has a processing means for receiving a sequence of signals from the photosensor during rotation of the vacuum head in order to determine the shape and geometric center of the wafer on the vacuum head. In addition, the means for rotating the vacuum head is connected to the processing means in order to receive a signal therefrom for subsequently rotating the vacuum head in order to place the geometric center of a received wafer on the longitudinal axis passing through the centering station and grinding station.

The transfer mechanism for moving the wafer from the centering station to the grinding station is constructed with an arm having a depending head thereon for engaging a wafer in the centering station, means for raising and lowering the arm and means for moving the arm horizontally and parallel to the longitudinal axis extending between the centering station and grinding station. In this way, the geometric center of the wafer is positively controlled and subsequently centered within the grinding station.

The grinding station includes a rotatable chuck for receiving and holding a wafer thereon, means for rotating the chuck, a grinding wheel for grinding an edge of a received wafer on the chuck and means for moving the grinding wheel along an axis perpendicular to the longitudinal axis extending between the centering station and grinding station during rotation of the chuck. In this respect, the means for moving the grinding wheel may include a stepper motor. Further, the processing means is connected between the thickness measuring means and the grinding wheel for adjusting the height of the grinding wheel relative to the chuck in dependence on the thickness of a measured wafer to be ground. In this way, the grinding wheel may be aligned symmetrically to the thickness of the wafer.

In addition, the stepper motor for moving the grinding wheel relative to the wafer is connected with the processing means so as to effect grinding of the wafer in dependence on the determined shape of the wafer relative to a predetermined shape. In this respect, the signals generated by the probe means at the centering station serve not only to define the shape of a wafer-to-be-ground but also permits matching of the determined shape against a predetermined shape.

By way of example, a wafer which is supplied to the edge grinder generally would have a circular periphery with a flat therein. The probe means at the centering station serves to generate a sequence of signals indicating the measured value of a plurality of points on the wafer periphery while the processing means is able to translate the signals so as to locate the flat while defining the shape of the wafer. These values are then matched against a predetermined or programmed shape for the wafer and signals are generated for transmission to the stepper motor of the grinding wheel so as to program the operation of the grinding wheel to obtain a wafer with a truly circular periphery and a truly straight flat. For example, when grinding the flat, the movement of the grinding wheel towards and away from the chuck and the rotation of the chuck are coordinated so that a straight edge is formed.

The transfer mechanism for moving a ground wafer from the grinding station to the loading station includes an arm having a depending head for engaging the wafer and moving the wafer to a transfer point for loading into the loading station. In addition, where a housing is provided at the grinding station to encase the grinding wheel and chuck, the transfer mechanism may also carry a cap for closing over an opening in the housing through which the depending head of the arm passes. This cap serves to close the housing so as to prevent blowing around the ground wafer particles during the grinding operation. Further, a vacuum means may be connected to the interior of the housing for withdrawing the ground wafer particles.

The method provided by the invention comprises the steps of mounting a wafer at a point on a predetermined longitudinal axis, measuring the distance of a plurality of points on an edge of the wafer relative to a fixed point, determining the shape and geometric center of the wafer based on the measured points, rotating the measured wafer to place the geometric center on the longitudinal axis and thereafter grinding the edge of the wafer in dependence on the determined shape relative to a predetermined shape while rotating the wafer about the geometric center.

The measurement of the wafer may be carried out during rotation of the wafer. Further, the measurement of the wafer may take place at a different position from the grinding position.

While grinding, the wafer may be rotated one revolution at a pre-programmed speed.

These and other objects and advantages of the invention will become more apparent from the following detailed description taken in conjunction with the accompanying drawings wherein:

FIG. 2 illustrates a schematic view of the various stations of the edge grinder in accordance with the invention;

FIG. 3 illustrates a plan view of the centering station in accordance with the invention;

FIG. 4 illustrates a plan view of the unloading station, centering station and transfer mechanism associated therewith in accordance with the invention;

Figure 7:
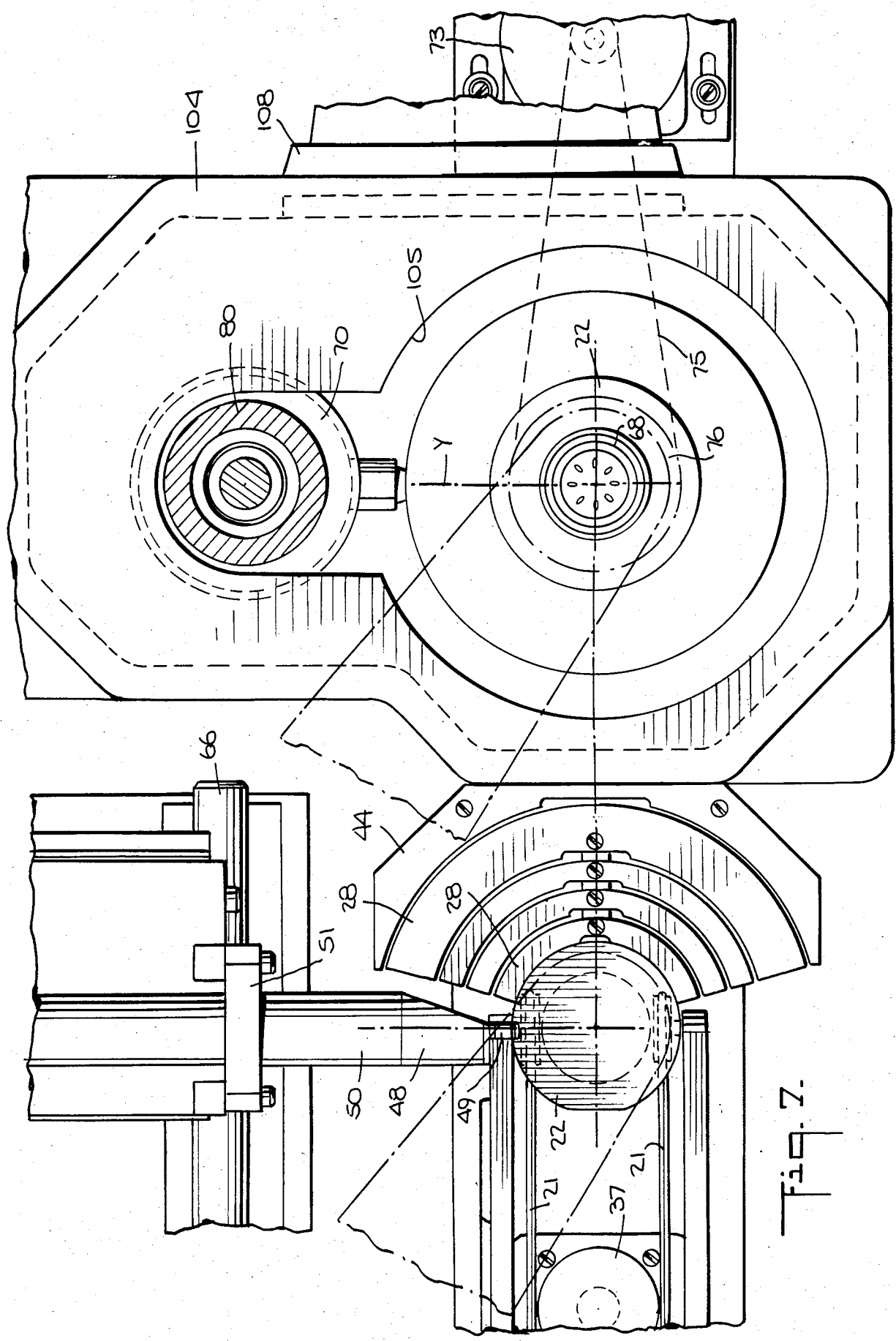

FIG. 7 illustates a part plan view of the grinding station in accordance with the invention;

FIG. 8 illustrates a part cross sectional view of the grinding station;

FIG. 9 illustrates an enlarged cross sectional view of the grinding station; and FIG. 10 illustrates a further enlarged view of a grinding wheel and wafer in the grinding station.

Figure 1:
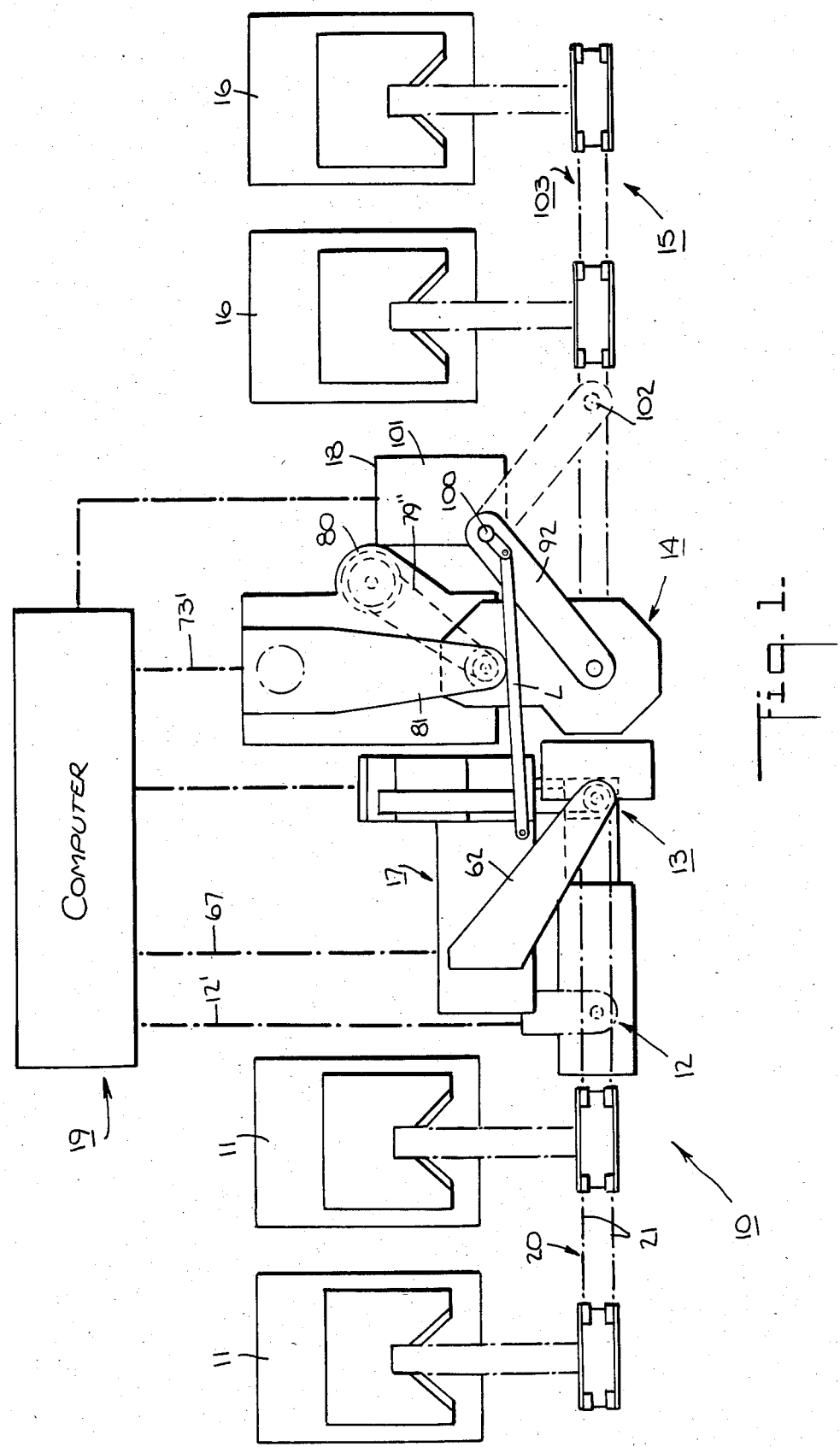
FIG. 1 illustrates a plan view of an automatic edge grinder constructed in accordance with the invention.

Referring to FIG. 1, the automatic edge grinder 10 includes a pair of wafer unloading stations 11, a thickness measuring station 12, a centering station 13, a grinding station 14 and a loading station 15 including a pair of load modules 16. In addition, a transfer mechanism 17 is disposed to move a wafer from the centering station 13 to the grinding station 14 while a second transfer mechanism 18 is provided to move a ground wafer from the grinding station 14 to the loading station 15. In addition, a processing means 19 in the form of a computer or central controller is connected to the unloading stations 11, measuring station 12, centering station 13, grinding station 14, transfer mechanisms 17, 18 and load modules 16 to control and coordinate the movements in the various stations.

Each unloading station 11 is of generally conventional construction and need not be further described in detail. For example, each unloading station 11 includes a cassette having a plurality of wafers (not shown) therein which can be individually and sequentially transferred onto an infeed conveyor 20 for delivery to pass the thickness measuring station 12 to the centering station 13. Each cassette is also provided with a sensor to indicate whether the cassette has wafers therein or is empty. Each sensor is, in turn, connected with the processing means 19 to deliver a signal thereto to indicate the state of the cassette -i.e. empty or not, while the processing means 19 is programmed to determine from which cassette a wafer is delivered in order to time the subsequent motions of the edge grinder 10 components. Also, after one unload station 11 completed unloading a cassette, an automatic change-over takes place to the other unload module 11 for unloading of the wafers therein.

As indicated in FIG. 4, the infeed conveyor 20 includes a pair of belts 21, for example, endless rubber belts on which a wafer 22 can be received and transported in a gentle manner. As also indicated in FIG. 4, each wafer 22 has a generally circular periphery 23 with a flat 24 therein. Such wafers 22 are of generally known shape and need not be further described.

Referring to FIGS. 1 and 2, the thickness measuring station 12 sequentially receives the series of wafers 22 and has a means in the form of an air gauge 25 for measuring the thickness of a conveyed wafer 22 at the center. As indicated in FIG. 2, the conveyed wafers 22 are conveyed along a longitudinal axis X which passes through the centering station 13 and grinding station 14 as further described below.

The air gauge 25 operates in known manner to determine the average thickness of each wafer 22 passing thereby and delivers a suitable signal to the processing means 19 for purposes as described below.

Referring to FIG. 2, the centering station 13 includes means 26 for centering a wafer 22 therein as well as a probe means 27 for aligning a centered wafer 22 relative to a longitudinal axis X.

Figure 5:
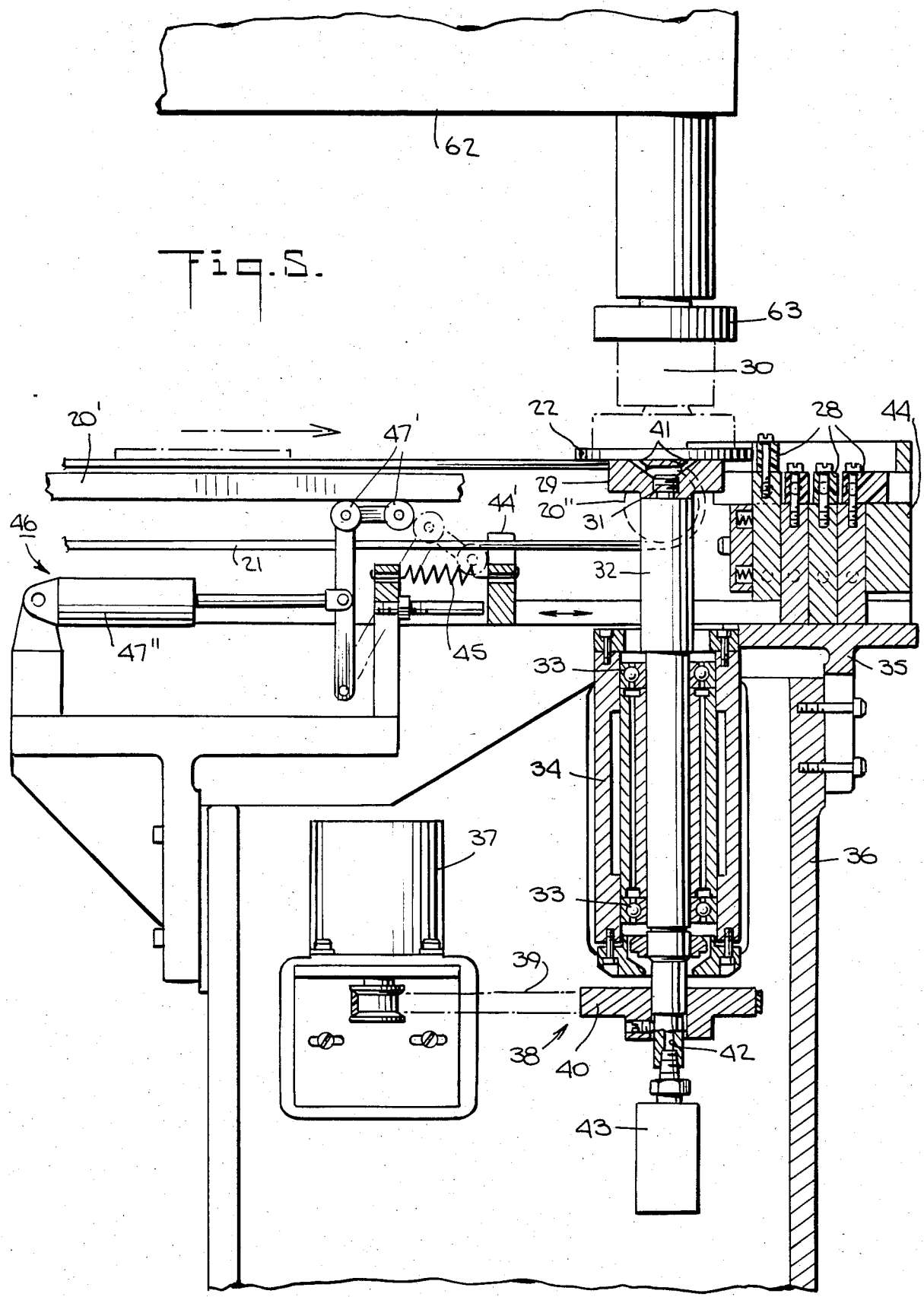
FIG. 5 illustrates a cross-sectional view of the centering station illustrating a plurality of centering stops and a vacuum head in accordance with the invention.

The means 26 for centering the wafer 22 includes a plurality of concentrically disposed arcuate centering stops 28, each of which is adjustably mounted to selectively abut and center a correspondingly sized wafer 22 received in the centering station. As indicated in FIGS. 4 and 5, the centering station 13 includes a vacuum head 29 which is centered on an axis 30 which is perpendicular to and which passes through the longitudinal axis X. The head 29 is secured on a threaded stem 31 of a shaft 32 which is rotatably mounted via suitable bearings 33 in a support 34 fixed to a stationary frame 36 of the edge grinder 10. A motor 37, such as a stepper motor, is fixedly mounted on the frame 36 via suitable means and drives the shaft 32 via a suitable transmission 38. As indicated, this transmission 38 includes a timing belt 39 for driving a pulley 40 fixed to the shaft 32.

In addition, the vacuum head 29 is provided with a plurality of apertures 41 which terminate in openings on the surface (FIG. 4) to form a circular pattern. The openings 41, in turn, communicate with a bore 42 passing through the shaft 32. In addition, a suitable connection 43, e.g. a mechanical rotary joint connected, is made at the lower end of the hollow shaft 32 in order to connect the shaft 32 to a vacuum source (not shown). In this way, when a vacuum is drawn on the bore 42 and openings 41 in the vacuum head 29, a wafer 22 can be held securely in place on the head 29.

Referring to FIGS. 4 and 5, the centering stops 28 are mounted within a frame 44 in a suitable manner so that each is individually adjustable in a vertical plane. A suitable means is also provided for securing each stop 28 in a raised position. Each stop 28 is sized of a different radius, for example from a radius of three inches to a radius of six inches. Of note, any suitable number of centering stops 28 may be provided so as to accommodate sizes of up to eight inches or more. Depending upon the nominal size of wafer being ground, the appropriate centering stop 28 is manually selected and raised into position. For example, as shown in FIG. 5, the smallest or first stop 28 is in a raised position while the others are in a depressed condition.

The frame 44 is slidably mounted on the bracket 35 secured to the machine frame 36 and is biased by a spring 45 fixed to the machine frame in a direction towards the vacuum head 29.

Referring to FIGS. 4 and 5, the infeed conveyor 20 is pivotally mounted at the end adjacent the unloading stations 11 while means 46 are provided at the opposite end adjacent the centering station 13 to move the conveyor 20 vertically so as to deposit a wafer 22 onto the vacuum head 29. To this end, the conveyor 20 has a pair of support arms 20' which support the pulley 20 over which the belts 21 pass while the means 46 includes an L-shaped lever 47 pivotally mounted and fixed via suitable bracket 36' to a stationary machine frame 36, a pair of cam follower rollers 47' rotatably mounted on the lever 47 and an air cylinder 47" which is pivotally mounted at one end and fixed via suitable bracket 36' to a stationary machine frame 36 and pivotally connected to the lever 47 at the opposite end. Upon actuation of the air cylinder 47", for example via a timing signal from the processing means 19, the piston of the cylinder 47" is extended to pivot the lever 47 in a clockwise direction, as viewed in FIG. 5, to lower the support arms 20' to deposit a wafer 22 on the vacuum head 29. At the same time, one of the cam follower rollers 47" abuts an upraised flange 44' on the carriage 44 to push the carriage 44 and, thus, the stop 28 away from the centered wafer 22 to provide a clearance e.g. of about ⅛ inch from the wafer 22.

When the air cylinder 47" is deactivated, the lever 47 is rotated counter-clockwise to a vertical position to lift the conveyor arms 20' while the carriage 44 is returned to the centering position by the spring 45.

The belts 21 of the infeed conveyor are positioned so that a delivered wafer 22 is initially abutted against a raised centering stop 28 while being positioned on the vacuum head 29. The conveyor belts 21 continue to move while the wafer 22 rests on the vacuum head 29. Shortly thereafter, vacuum is applied to the head 29 so that a vacuum is generated to hold the wafer 22 securely in place. Thereafter, the shaft 32 and head are rotated by the motor 37 via the transmission 38 for reasons as described below.

The motor 37 of the centering station is suitably connected to the processing means 19 so that the motor can be activated at a suitable point in time after a wafer 22 has been received on the vacuum head 29.

Figure 6:
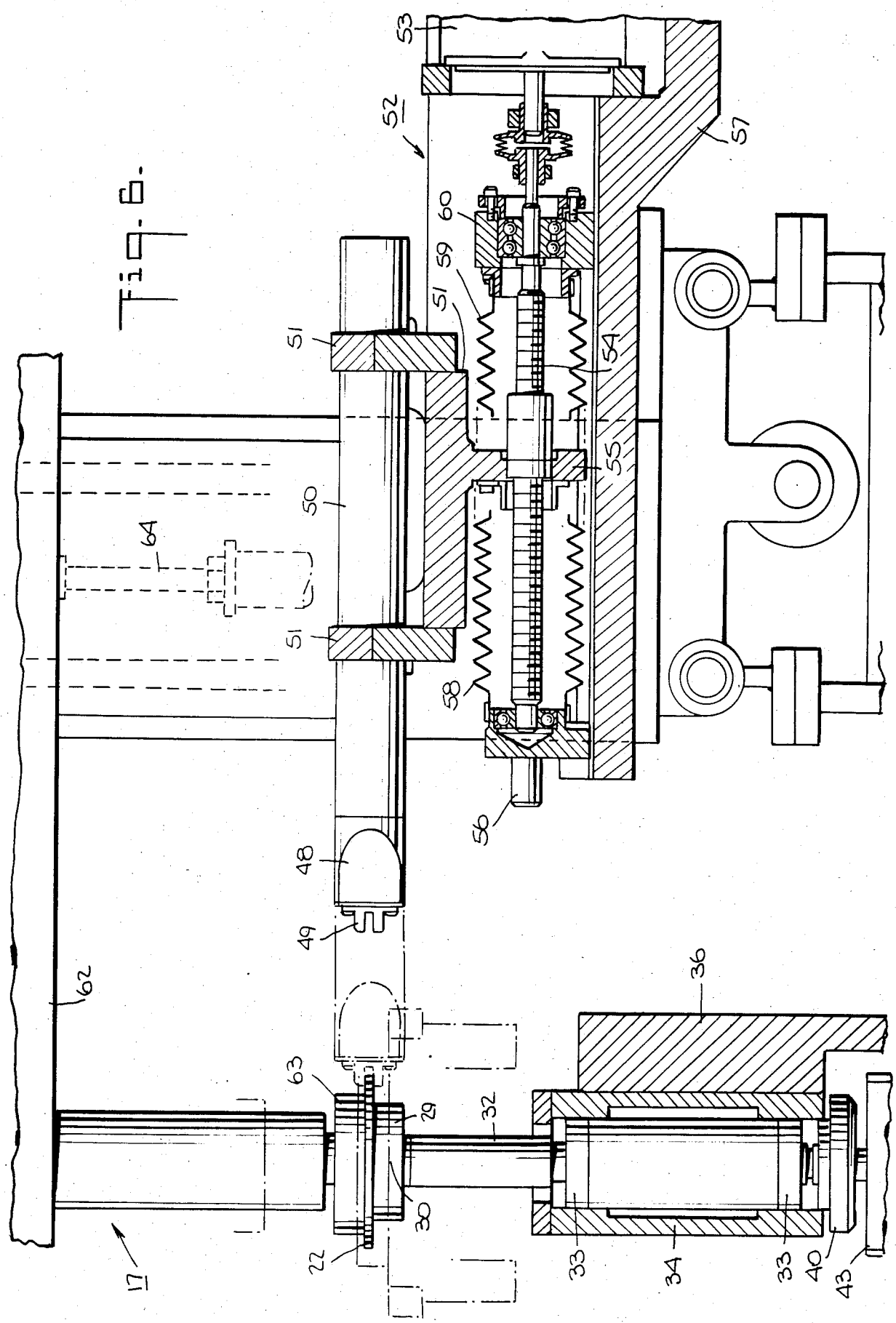
FIG. 6 illustrates a part cross-sectional view of a probe means employed in the centering station in accordance with the invention.

Referring to FIGS. 4 and 6, the probe means 27 includes a photosensor 48 which includes a bifurcated extension 49 having two arms, in one of which a light source and in the other of which a light receptor are respectively received. The photosensor 48 is mounted on a cylindrical housing 50, which in turn, is mounted on a support 51. A means 52 is also provided for moving the support transversely of the longitudinal axis X (see FIG. 3) in order to position the photosensor 48 at an edge of a wafer 22 in the centering station (see FIG. 6). This means 52 includes a motor 53, a lead screw 54 which is rotated by the motor 53 in a conventional manner and a nut arrangement 55 which is threaded on the lead screw 54 and secured to the support 51. During rotation of the lead screw 54, the nut 55 serves to move the support 51 relative to the screw 54. A sensor (not shown) is also provided to indicate the "home" position of the photosensor 48.

In addition, a pair of rails 56 are fixedly mounted on a base 57 which also serves to support the motor 53. These rails 56 are received in suitable slides of the support 51 so that the support 51 can be guided back and forth in a smooth reliable manner.

As indicated in FIG. 6, bellows 58, 59 are disposed about the lead screw 54 and between the nut 55 and bearing supports 60 for the lead screw 54 in order to seal the lead screw 54 against the influx of dirt and the like.

As indicated in FIG. 6, the photosensor 48 is movable from a retracted position to a position adjacent to the wafer 22 in the centering station. In this regard, the bifurcated end 49 of the photosensor 48 straddles the edge of the wafer 22. During operation, the photosensor 48 moves toward the wafer 22 and stops upon sensing the edge of the wafer 22. A signal is then generated corresponding to the distance moved by the photosensor from a "home" position, i.e. the initial rest position. As the wafer 22 is rotated with the vacuum head 29, the photosensor 48 is reciprocated so that a plurality of signals are generated corresponding to the distance of the sensed wafer edge from the "home" position. In this respect, the edge of the wafer is determined by the position of the receptor of the photosensor 48 relative to the "home" position.

The photosensor 48 is connected to the processing means 19 in order to deliver the sequence of signals during rotation of the vacuum head 29 and, thus, the wafer 22. The processing means 19, in turn, calculates the distance of each sensed point relative to a fixed point such as the axis of rotation of the vacuum head while also determining the shape and geometric center of the wafer from these signals.

Once the shape and geometric center of the wafer 22 have been determined, the processing means 19 delivers a signal to the motor 37 for the shaft 32 so that the shaft 32 can be rotated a predetermined increment to position the geometric center of the wafer 22 on the longitudinal axis X. For example, as indicated in FIG. 3, should the geometric center 61 be located off the axis X, the shaft and vacuum head 29 are rotated so that the geometric center 61 is brought onto the axis X.

Referring to FIGS. 5 and 6, the transfer mechanism 17 includes an arm 62 having a depending head 63 for engaging a wafer 22 on the vacuum head 29 of the centering station 13. As indicated in FIG. 6, the head 63 is of slightly larger diameter than the vacuum head 29. Further, the head 63 can be constructed in similar manner to the vacuum head 29 so that a vacuum force can be generated therein to lift the wafer 22 for transport to the grinding station (not shown).

The transfer mechanism 17 also includes a means 64 (see FIG. 6) for raising and lowering the arm 62, for example along vertical guide rails (not shown), relative to the centering station 13 and grinding station 14. Any suitable means may be used for this purpose, for example, a pneumatically controlled means.

Referring to FIG. 4, a transfer mechanism includes a frame 65 on which the arm 62 is mounted as well as means for moving the frame 65 horizontally. This means includes a motor and lead screw arrangement similar to that for moving the photosensor 48 as well as a pair of guide rails 66 on which the frame 65 is slidably mounted. As indicated in FIG. 4, the rails 66 are disposed in parallel to the longitudinal axis X so that the arm 62 moves in parallel to the longitudinal axis X between the centering station 13 and the grinding station 14.

As above, the transfer mechanism 17 is connected via a suitable line 67 to the processing means 19 in order to be actuated in appropriate sequence thereby.

Referring to FIGS. 7 and 8, the grinding station 14 includes a rotatable chuck 68 for receiving and holding a wafer 22, means 69 for rotating the chuck 68, a grinding wheel 70 for grinding an edge of the wafer 22 on the chuck 68 and means 71 for moving the grinding wheel 70 along an axis Y perpendicular to the longitudinal axis X during rotation of the chuck 68.

Referring to FIGS. 8, 9 and 10, the chuck 68 is in the form of a vacuum head similar to the vacuum head 29 of the centering station 13.

Referring to FIG. 8, the means 69 for rotating the chuck 68 includes a hollow shaft 72, a motor 73 such as a stepper motor (see FIG. 7) and a transmission 74 which includes a timing belt 75 and a pulley 76 on the shaft 72. The motor 73 is connected with the processing means 19 via a suitable line 73' (see FIG. 1) for actuation thereby.

A suitable source of vacuum is connected to the hollow shaft 72 via a mechanical rotary joint connector 77 so as to draw a vacuum on the chuck 68.

Referring to FIGS. 8 and 10, the grinding wheel 70 is of generally conventional structure and is provided with a recess 78 for edge grinding the wafer into a predetermined profile, such as a parabolic shape. The grinding wheel 70 is mounted on a shaft 79 which is journalled in a housing 79' and driven via a transmission belt 79" from a motor 80, for example a variable speed motor, which is connected via a line to the processing means 19. As shown, the housing 79' and motor 80 are mounted on a bracket 81 which in turn is fixedly supported on a member 82 which is vertically movable along a pair of guide posts 83 by means of a motor 84 and lead screw arrangement 85 in a manner similar to the photosensor 48 of the probe means 27. The motor 84 is also connected to the programming means 19 so as to receive a signal in dependence upon the measured thickness of a wafer when initially at the thickness measuring station 12. for example, if the measured thickness of a wafer 22 is thicker than nominal, the motor 84 is actuated to raise the housing 79' and associated grinding wheel 70 an appropriate amount to center the grinding wheel 70 relative to the wafer 22 when being ground, for example as indicated in FIG. 10.

The means 71 for moving the grinding wheel 70 on the axis Y includes a motor 86, a lead screw and nut arrangement 87, as above, a carriage 88, a pair of guide rails 89 and a support 90 which is fixed to the carriage 88 and which carries the vertical posts 83. The motor 86 is connected to the processing means 19 so as to receive suitable signals therefrom for moving the carriage 88 along the rails 89, and, thus, the grinding wheel 70 along the axis Y. In this respect, the processing means 19 actuates the motor 86 in dependence upon the signals received from the probe means 27. For example, when the processing means 19 receives the measurement signals from the probe means to determine the shape of the wafer in the centering station 13, the determined shape is compared against a predetermined shape so that the difference between the actual shape of the wafer and the shape to which the wafer is to be ground are obtained. Signals corresponding to these differences are then delivered by the programming means 19 to the motor 86 for moving the grinding wheel 70. At the same time, suitable signals are delivered to the motor 73 of the rotatable chuck 68 so that the rotation of the wafer 22 in the grinding station 14 and the movement of the grinding wheel 70 along the axis Y are coordinated.

The processing means 19 is programmed so that the shape of the wafer is determined from the sets of signals received from the probe means 27. This permits the processing means 19 to determine where the flat 24 of the wafer 22 is located not only with respect to the wafer but also with respect to the position of the vacuum head 29 of the centering station 13.

Thereafter, the processing means 19 is programmed to determine a plane parallel to the flat in which the geometric center of the wafer is located. Next, the geometric center is located on this plane while at the same time being located with respect to the longitudinal axis X passing through the axis 30 of the centering station 13 and the central axis 91 of the rotatable chuck 68 of the grinding station 14. The vacuum head 29 can then be rotated a determined amount so as to place the geometric center of the wafer on the longitudinal axis X.

At the same time as these calculations are being made, the processing means also delivers suitable signals to the motor 86 for moving the grinding wheel 70 and the motor 73 of the chuck 68 of the grinding station 14 in order to subsequently grind the wafer 22 to the desired shape. In this respect, the transfer mechanism 17 serves to place the geometric center 61 of the wafer 22 on the central axis 91 of the chuck 68. Thus, during rotation of the wafer 22 in the grinding station, the grinding wheel 70 is able to the grind the circular periphery 23 of the wafer to a true circle by grinding more or less material from the circular periphery 23. When the flat 24 of the wafer comes into initial contact with the grinding wheel 70, the wheel is moved along the axis Y towards the wafer via a stepping motor until reaching the mid-point of the flat and then is moved in a direction away from the wafer 22 so as to grind a straight edge.

Referring to FIG. 8, the transfer mechanism 18 includes an arm 92 having a depending head 93 for engaging a wafer 22 on the chuck 68 of the grinding station 14. As indicated in FIG. 10 the head 93 includes a plurality of internal ports 94 which communicate with a bore (not shown) in a hollow shaft 95 on which the head 93 is mounted. In addition, the shaft 95 is connected to a flexible line 96 in the arm 92 which can be alternately connected with a vacuum source (not shown) or a compressed air source (not shown) Thus, when the head 93 engages a wafer 22 as indicated in FIG. 10, the air may be blown through the ports 94 so that a cushion of air exists between the head 93 and the wafer 22 so as to blow ground particles from the wafer 22. As also indicated in FIG. 10, a lip seal 97 may be provided on the head 93 for lightly engaging the top of the wafer 22 while a similar lip seal 98 is provided on the chuck 68 to engage the underside of the wafer 22.

Referring to FIG. 9, a suitable compreseed air assembly 99 may be disposed about the chuck 68 so as to deliver a flow of compressed air to the underside of the wafer 22 outside of the lip 98. For example, the compressed air assembly 99 includes a plenum 99' which is disposed about the chuck 68 in spaced concentric relation to define an annular gap as well as a compressed air line 99" which connects a suitable source of compressed air (not shown) into the plenum 99' so that an annular curtain of air can be blown onto the bottom periphery of the wafer 22. A suitable valve (not shown) may be disposed on the line 99" and may be controlled by the processing means 19 to open at the same time a vacuum is on and the wafer 22 is being ground. This serves to keep the bottom wafer edge relatively clean during grinding and, for example, prior to a rinsing and drying operation as described below.

The transfer arm 92 is also mounted on an upstanding hollow post 100 which can be rotated by a suitable drive means 101 (see FIG. 1) so as to pivot the arm 62 from a position over the center lines of the chuck 68 in the grinding station 14 through a transfer point 102 over the conveyor 103 of the loading station 15. In addition, suitable means are provided for raising and lowering the arm 92 and head 93 relative to the chuck 68 and the transfer point 102. For example, a pneumatic cylinder may be used for raising and lowering the post 100.

As shown in FIG. 1, the transfer mechanism 17 and transfer arm 92 are interconnected via a suitable linkage L to move in synchronism. Thus, as the transfer mechanism 17 moves a wafer from the centering station 13 to the grinding station 14, the transfer arm 92 moves a ground wafer from the grinding station to the loading station 15.

Referring to FIG. 9, a housing 104 encloses the chuck 68 and grinding wheel 70 and is provided with a suitably shaped opening 105 in the top side to permit passage of the housing 79' as well as a wafer 22 (see FIG. 7). In addition, a cap 106 is mounted on a housing 92' in which the shaft 95 of the transfer mechanism 18 is disposed. The cap 106 is shaped of generally circular shape with a small circular recess therein to close over the opening 105 in the housing 104 when the head 93 engages a wafer 22. The cap 106 then serves to close the housing 104 against any outflow of ground particles from the wafer 22 during a grinding operation. Further, the housing 104 may be provided with an opening 107 to which a vacuum hose 108 (see FIG. 7) is connected in order to draw off the ground particles from the wafer during operation via a suitable vacuum source.

The housing 104 may also be provided with manifold blocks (not shown) constructed to introduce first a stream of rinse coolant and then an air stream to blow dry the top and bottom of the wafer edge. This part of the cycle would take place after the grind and would require at least one revolution of the wafer.

Referring to FIG. 1, the loading station 15 includes a pair of load stations 16 which are of generally conventional structure and to which ground wafers are fed in known manner via an outfeed conveyor 103 similar to the infeed conveyor 20.

The various operating components of the edge grinder 10 are connected to the processing means 19 so that the individual operations of these components can be actuated and coordinated with each other. To this end, the processing means 19 is a commercially available Giddings & Lewis PC 409 programmable controller which is programmed to coordinate the various motions of the edge grinder 10 once the edge grinder 10 has been activated, for example via a button switch. Of course, the edge grinder 10 is powered electrically and is connected by suitable means to a power source.

As indicated throughout, various types of seals or bellows may be provided about various bearings and rotating parts in order to seal against ground particles which are generated during operation.

Initially, the edge grinder 10 is actuated, for example, by pushing a push button on a control panel (not shown). At this time, one of the two unloading cassettes is actuated to deliver a wafer. The sensor associated with this unloading station thus delivers a signal to the processing means 19 so that the timing of the subsequent operations of the edge grinder 10 can be coordinated. Next, the wafer is deposited on the infeed conveyor 20 and moved past the thickness measuring station 12. At this time, the thickness of the wafer 22 is detected and a suitable signal passed via a line 12' (FIG. 1) to the processing means 19. When the wafer is subsequently placed in the grinding means 14, this signal is used to raise and lower the grinding wheel 70, if necessary, in order to align the grinding wheel 70 with the wafer.

After passing the thickness measuring station 12, the wafer 22 is brought up against a centering stop 28 and centered. Thereafter, the air cylinder 47" (FIG. 4) is actuated to lower the conveyor 20 to deposit the wafer 22 on the vacuum head 29 of the centering station 13 while the stop frame 44 is pushed away to provide a clearance. The motor 53 of the probe means 27 is then activated so that the bifuricated photosensor 48 is reciprocated towards and away from the edge of the wafer 22. At the same time, the head 29 is connected with a vacuum source so that the wafer 22 is firmly held in place and the motor 37 is actuated via the processing means 19 to rotate the head 29 one revolution (360°). The photosensor 48 may be activated to deliver signals at spaced apart intervals, for example 15° increments of wafer rotation via suitable lines to the processing means 19 for comparison with a predetermined shape to which the wafer is to be matched or to be ground. Differences between the detected shape and the predetermined shape are then obtained within the processing means 19 so that the motor for the grinding wheel 70 can be moved along the axis Y relative to the chuck 68 of the grinding station 14 (see FIG. 7) at a subsequent time.

Next, the geometric center of the wafer is also determined by the processing means 19 and a signal emitted to the motor 37 so as to rotate the vacuum head 29 a sufficient amount to place the geometric center on the longitudinal axis X. Next, the transfer mechanism 17 is actuated via the processing means 19 so as to lower the head 63 onto the wafer, to effect a vacuum in the head 63 while disconnecting the vacuum head 29 from a vacuum source and to raise head 63. The arm 62 of the transfer mechanism is then moved via the guide rails 66 parallel to the longitudinal axis X at a predetermined amount until the geometric center of the wafer is on the center line of the chuck 68 of the grinding station 14. Next, the head 63 is lowered to place the wafer 22 on the chuck 68. Vacuum to the head 63 is then released while vacuum is supplied to the chuck 68 to hold the wafer 22 in place. The transfer mechanism 17 is then moved back to the initial position.

During the return motion of the transfer mechanism 17, the arm 92 of the transfer mechanism 18 is pivoted over the housing 104 due to the linkage L. The arm 92 is lowered so that the head 93 (FIG. 9) engages on the centered wafer 22 to hold the wafer 22 in place for grinding. At the same time, the cap 106 seats on the top of the housing to close off the opening 105. At this time, a small gap is disposed between the recess in the cap 106 and the housing 79" so as to permit movement of the grinding wheel 70 along the axis Y. Since the position of the wafer 22 on the chuck 68 is controlled, the processing means 19 is able to move the grinding wheel 70 along the axis Y while the chuck 68 is rotated so as to form a oround circular periphery on the wafer and a straight flat.

If the edge of the wafer 22 is to be simply ground to a predetermined shape such as a parabolic shape, only enough material is ground from the edge to achieve the contour. In this respect, the signals from the processing means 19 to the motor 86 for moving the grinding wheel 70 are such that only relatively small amounts of material is removed. On the other hand, if grinding is to change the shape of the wafer, for example if an oval shaped wafer is to be ground to a circular shape, the signals from the processing means 19 to the motor 86 are sufficient to cause a greater amount of material to be ground from the edge of the wafer 22 so as to conform to the programmed wafered shape.

After grinding and any rising and drying operation, the arm 92 of the transfer mechanism 18 is raised with the vacuum holding the ground wafer 22 to the head 93. At this time, vacuum to the chuck 68 is stopped. The arm 92 is then pivoted over the transfer point 102 to the loading station 15. The arm 92 is then lowered and the vacuum in the head 93 cut off so that the wafer 22 can be deposited on the conveyor 103 for delivery to a load module 16. During this time, the transfer mechanism 17 is moved to bring a fresh wafer over and onto the grinding station.

In the event that a different sized wafer is to be ground, minor changes and adjustments are made in the grinder 10. For example, the appropriate centering stop is lifted into place and the appropriate cassettes are used in the loading station and unloading station. Finally, the processing means 19 is switched to a mode corresponding to the predetermined shape desired for the newly sized wafers. Thus, the machine is able to function with a minimum down time during changeover.

The machine may be used to grind wafers having one or more flats, for example two, three or four flats which are oriented in any position.

The machine may also be provided with suitable attachments for lubricating and washing and drying the wafers during and after grinding.

The edge grinder may be modified in various ways. For example, the probing and grinding operations may be carried out in one station. In such a case, there would not be a need to locate the geometric center of a delivered and centered wafer on a longitudinal axis through the combined centering/grinding station. Instead, the processing means 19 may use the signals received from the photosensor to program the grinding wheel so as to compensate for the geometric center of the wafer during rotation of the wafer for grinding purposes.

In addition, various "home" position sensors can be used on the three accurately disposed motions, that is the probing motion, the grinding wheel horizontal motion and the grinding wheel vertical motion. Still further, all of the stepping motors can be replaced with analog motors which would be governed by position location means and the processing means would be tailored accordingly.

The invention thus provides an edge grinder which is of relatively simple construction and one which can be readily changed-over to accommodate different sized wafers.

Further, the invention provides an edge grinder which does not rely upon a mechanical arrangement for controlling the grinding of a wafer.

The invention further provides an edge grinder which is capable of relatively high speed operation, for example, handling about one hundred fifty wafers of three inch to four inch size per hour.

What is claimed is:

1. An automatic edge grinder comprising
   at least one wafer unloading station for delivering a series of wafers;
   a thickness measuring station for sequentially receiving the series of wafers, said measuring station having means for measuring the thickness of a delivered wafer;
   a centering station having means for centering a wafer therein and probe means for aligning a centered wafer relative to a longitudinal axis;
   a grinding station having means for grinding an edge of a received wafer;
   a first transfer mechanism for moving a centered and aligned wafer from said centering station in parallel to said axis to said grinding station;
   at least one loading station for receiving a series of edge-ground wafers; and
   a second transfer mechanism for moving an edge-ground wafer from said grinding station to said loading station.

2. An automatic edge grinder as set forth in claim 1 wherein said means for measuring includes an air gauge for sensing a thickness at a central region of a wafer.

3. An automatic edge grinder as set forth in claim 1 wherein said centering means includes a plurality of concentrically disposed arcuate centering stops, each stop being adjustably mounted to selectively abut and center a correspondingly sized wafer received in said centering station.

4. An automatic edge grinder as set forth in claim 3 wherein said centering station includes a head for receiving a received wafer in said centering station and means for rotating said head.

5. An automatic edge grinder as set forth in claim 4 wherein said head is a vacuum head having openings therein and said means for rotating said head includes a shaft having a bore in communication with said openings and which further comprises a vacuum source in communication with said bore to create a suction force at said head to hold a wafer thereon during rotation of said shaft.

6. An automatic edge grinder as set forth in claim 1 wherein said centering station includes a head for receiving a received wafer in said centering station and means for rotating said head and said probe means includes a photosensor for sensing the distance of a point on a edge of a wafer in said centering station relative to a fixed point and generating a signal corresponding thereto.

7. An automatic edge grinder as set forth in claim 6 which further comprises a processing means for receiving a sequence of signals from said photosensor during rotation of said head to determine the shape and geometric center of the wafer on said head.

8. An automatic edge grinder as set forth in claim 7 wherein said means for rotating said head is connected to said processing means to receive a signal therefrom to rotate said head to place the geometric center of a received wafer on said longitudinal axis.

9. An automatic edge grinder as set forth in claim 6 wherein said probe means further includes a support mounting said photosensor thereon and means for moving said support transversely of said longitudinal axis to position said photosensor at an edge of a wafer in said centering station.

10. An automatic edge grinder as set forth in claim 1 wherein said first transfer mechanism includes an arm having a depending head thereon for engaging a wafer in said centering station, means for raising and lowering said arm relative to said centering station and said grinding station, and means for moving said arm horizontally in parallel to said longitudinal axis between said centering station and said grinding station.

11. An automatic edge grinder as set forth in claim 1 wherein said grinding station includes a rotatable chuck for receiving and holding a wafer thereon, means for rotating said chuck, a grinding wheel for grinding an edge of a wafer on said chuck and means for moving said grinding wheel along an axis perpendicular to said longitudinal axis during rotation of said chuck.

12. An automatic edge grinder as set forth in claim 11 wherein said means for moving said grinding wheel includes a stepper motor.

13. An automatic edge grinder as set forth in claim 11 which further comprises a processing means connected between said thickness measuring means and said grinding wheel for adjusting the height of said grinding wheel relative to said chuck in dependence on the thickness of a measured wafer to be ground.

14. An automatic edge grinder as set forth in claim 13 wherein said grinding station includes a second motor connected to said grinding wheel for raising and lowering said wheel, said second motor being connected to said processing means to receive a signal therefrom for raising and lowering said wheel.

15. An automatic edge grinder as set forth in claim 11 wherein said centering station includes a head for receiving a received wafer in said centering station and means for rotating said head, said probe means includes a photosensor for sensing the distance of a point on an edge of a wafer in said centering station relative to a fixed point and generating a signal corresponding thereto and which further comprises a processing means for receiving a sequence of signals from said photosensor to determine the shape of the wafer on said head, said processing means being connected to said means for moving said grinding wheel to effect grinding of a wafer on said chuck in dependence on the determined shape of the wafer relative to a predetermined shape.

16. An automatic edge grinder as set forth in claim 1 wherein said grinding station includes a housing having an opening for positioning of a wafer therein and said second transfer mechanism includes an arm having a depending head thereon for engaging a wafer in said grinding station and a cap for closing over said opening during grinding of a wafer.

17. An automatic edge grinder as set forth in claim 16 which further comprises a vacuum means connected to the interior of said housing for withdrawing ground wafer particles therefrom.

18. In an edge grinder, the combination comprising
a rotatable chuck for receiving and holding a wafer thereon;
means for rotating said chuck about a central axis of said chuck;
a grinding wheel for grinding an edge of a wafer on said chuck;
means for moving said grinding wheel in predetermined increments along an axis perpendicualr to said central axis during rotation of said chuck; and
a processing means connected to said means for moving said grinding wheel to effect grinding of a wafer on said chuck in dependence on a determined shape of the wafer relative to a predetermined shape.

19. The combination as set forth in claim 18 wherein said means for moving said grinding wheel includes a stepper motor.

20. The combination as set forth in claim 18 wherein said predetermined shape has a circular periphery of constant radius with a flat therein.

21. In an edge grinder, the combination comprising
a head for receiving a wafer having a circular periphery with a flat therein;
means for rotating said head about a central axis of said head;
a probe means for sensing the distance of each of a plurality of points on an edge of the wafer relative to a fixed point and generating a sequence of signals corresponding thereto; and
processing means for receiving the sequence of signals from said probe means to determine the shape and geometric center of the wafer, said processing means being connected to said means for rotating said head to place the geometric center of the wafer on a predetermined longitudinal axis perpendicular to said central axis.

22. The combination as set forth in claim 21 which further includes a transfer mechanism for moving the wafer from said head in parallel to said longitudinal axis.

23. The combination as set forth in claim 21 wherein said probe means includes a photosensor for sensing the distance of a point on an edge of a wafer in said centering station relative to a fixed point and generating a signal corresponding thereto.

24. A method of edge grinding a wafer having a circular periphery with a flat, said method comprising the steps of
mounting a wafer at a point on a predetermined longitudinal aixs;
measuring the distance of a plurality of points on an edge of the wafer relative to a fixed point;
determining the shape and geometric center of the wafer based on the measured points;
rotating the measured wafer to place the geometric center of the wafer on said longitudinal axis; and
thereafter grinding the edge of the wafer in dependence on the determined shape relative to a predetermined shape while rotating the wafer about the geometric center thereof.

25. A method as set forth in claim 24 which further includes the steps of rotating the wafer about said fixed point during said measuring step.

26. A method as set forth in claim 25 which further includes the step of moving the wafer along said longitudinal axis from said fixed point to a second point on said axis for grinding of the wafer edge thereat.

27. A method as set forth in claim 24 wherein said step of grinding includes rotating the wafer one revolution at a pre-programmed speed.

28. A method as set forth in claim 24 wherein said step of grinding includes rotation of the wafer to grind the circular periphery thereof, stopping rotation of the wafer with the flat thereof parallel to said longitudinal axis and thereafter grinding the flat.

29. In an edge grinder, the combination comprising a
rotatable chuck for receiving and holding a wafer thereon;
means for rotating said chuck about a central axis of said chuck;
a grinding wheel for grinding an edge of a wafer on said chuck;
means for moving said grinding wheel in predetermined increments along an axis perpendicular to said central axis during rotation of said chuck;
a housing surrounding said chuck and said grinding wheel; and
a vacuum means connected to an interior of said housing for withdrawing ground wafer particles therefrom.

30. In an edge grinder, the combination comprising
a rotatable chuck for receiving and holding a wafer thereon;
means for rotating said chuck about a central axis of said chuck;
a grinding wheel for grinding an edge of a wafer on said chuck;
means for moving said grinding wheel in predetermined increments along an axis perpendicualr to said central axis during rotation of said chuck;
a probe means for sensing the distance of each of a plurality of points on an edge of a wafer relative to a fixed point and generating a sequence of signals corresponding thereto; and
processing means for receiving the sequence of signals from said probe means to determined the shape and geometric center of the wafer, said processing means being connected to said means for moving said grinding wheel to effect grinding of the wafer on said chuck in dependence on said determined shape relative to a predetermined shape.

31. In an edge grinder, the combination comprising a
rotatable chuck for receiving and holding a wafer having a generally circular peripitery with a flat therein;
means for rotating said chuck about a central axis of said chuck;
a grinding wheel for grinding an edge of a wafer on said chuck;
means for moving said grinding wheel in predetermined increments along an axis perpendicualr to said central axis during rotation of said chuck;
a head for receiving a wafer;
means for rotating said head;
a probe for sensing the distance of each of a plurality of points on an edge of a wafer relative to a fixed point and generating a sequence of signals corresponding thereto; and
processing means for receiving the sequence of signals from said probe means to determined the shape and geometric center of the wafer, said processing means being connected to said means for rotating said head to place the geometric center of the wafer on a logitudinal axis perpendicular to said axis along which said grinding wheel moves.

* * * * *